United States Patent [19]

Ferrada

[11] Patent Number: 4,838,076

[45] Date of Patent: Jun. 13, 1989

[54] DISPLAY FOR DISPLAYING THE VELOCITY OF A VEHICLE AND THE ROTATIONAL SPEED OF THE VEHICLE ENGINE

[75] Inventor: Stephen Ferrada, Unterreichenbach, Fed. Rep. of Germany

[73] Assignee: Daimler-Benz Aktiengesellschaft, Stuttgart, Fed. Rep. of Germany

[21] Appl. No.: 201,455

[22] Filed: Jun. 2, 1988

[30] Foreign Application Priority Data

Jun. 2, 1987 [DE] Fed. Rep. of Germany ....... 3718439

[51] Int. Cl.⁴ .......................................... G01M 15/00
[52] U.S. Cl. ......................................... 73/489; 73/116

[58] Field of Search .................. 340/716, 745; 73/116, 73/117.3, 489, 495, 499, 510; 116/284, 285, 286, 289, 290, 300

[56] References Cited

U.S. PATENT DOCUMENTS 1,252,102  1/1918  Erdle ................................ 73/489 X
3,608,368  9/1971  Cuff .................................. 73/117.3

Primary Examiner—Jerry W. Myracle
Attorney, Agent, or Firm—Barnes & Thornburg

[57] ABSTRACT

A display for displaying the velocity of a vehicle and the rotational speed of the vehicle engine is proposed, the velocity being represented in an annular segment and the speed being represented within a sector-shaped electronic indicator as quasi-analog luminous display band.

5 Claims, 1 Drawing Sheet

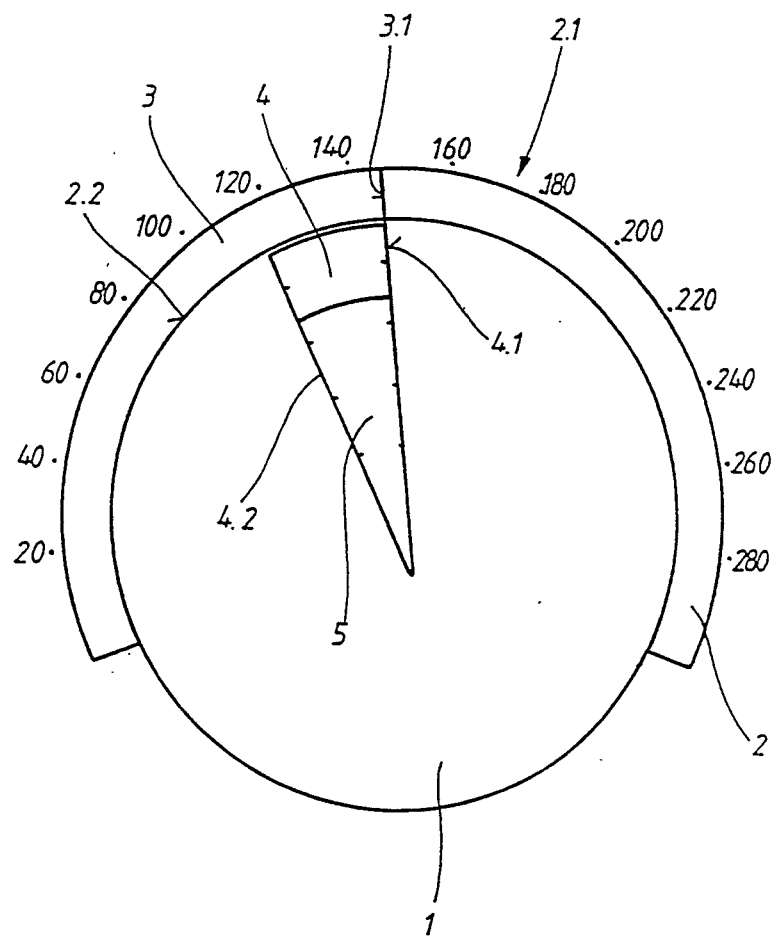

ial speed of the vehicle engine, the instrument fitted in the dashboard of the vehicle has an instrument disc 1 with an annular segment 2 having a velocity scale 2.1. The velocity is represented in a known way by a colored quasi-analog luminous band display 3, the velocity depicted in the drawing being 145 km/h.
DISPLAY FOR DISPLAYING THE VELOCITY OF A VEHICLE AND THE ROTATIONAL SPEED OF THE VEHICLE ENGINE

BACKGROUND AND SUMMARY OF THE INVENTION

The invention relates to a display for displaying vehicle engine rotational speed and vehicle driving speed.

A display of this general type is already known (German Periodical: mot 7/1982, Page 104, figures at bottom left), in which both the velocity and the rotational speed are represented in a scaled annular segment of the instrument discs as a quasi-analog luminous band display. The instrument discs or segments are in this case arranged at a distance from each other and to this extent are comparable to two conventional separate display instruments.

A similar arrangement is known (German Periodical: auto-motor-sport 25/1985, Page 44 figure in the right-hand column), which shows a display in which both the velocity and the rotational speed are each represented in a scaled angular bar segment of a screen as a quasi-analog luminous band display.

Furthermore, a display is known (German Periodical: auto-motor-sport 11/1985, Page 135, FIG. 4), in which likewise both the velocity and the rotational speed are represented in a manner of a line diagram on the instrument disc as a quasi-analog luminous display.

An object of the invention is to design a display of the above-noted general type in such a way that the rotational speed can also be represented in a configuration which is visually equally recognizable and is logically associated within the velocity, within the instrument disc for the velocity display.

This object is achieved according to the invention by providing a display for displaying the velocity of a vehicle and the rotational speed of the vehicle engine, the velocity being represented in a scaled annular segment and the speed being represented in a further scaled segment of an instrument disc as a quasi-analog luminous band display, wherein the further segment is designed as an acute-angled, sector-shaped electronic indicator, extending approximately from the center of the annular segment and constantly following the velocity display, and wherein the speed is represented within the sector shaped indicator as a radially outward running luminous band display.

In certain preferred embodiments the critical speed range is represented by the luminous band display in the indicator approaching or touching the luminous band display in the annular segment.

In certain preferred embodiments the luminous band display in the indicator flashes intermittently in the critical speed range.

The critical speed range is predetermined in dependence on the engine operating characteristic and is to be established to avoid engine damage due to excessive engine rotational speeds.

Other objects, advantages and novel features of the present invention will become apparent from the following detailed description of the invention when considered in conjunction with the accompanying drawings.

BRIEF DESCRIPTION OF THE DRAWINGS

The single drawing figure schematically depicts a display constructed according to a preferred embodiment of the invention.

DETAILED DESCRIPTION OF THE DRAWINGS

As a display for displaying the velocity of a vehicle and the rotational speed of the vehicle engine, the instrument fitted in the dashboard of the vehicle has an instrument disc 1 with an annular segment 2 having a velocity scale 2.1. The velocity is represented in a known way by a colored quasi-analog luminous band display 3, the velocity depicted in the drawing being 145 km/h.

The instrument disc is also designed with a contrasting, acute-angled, sector-shaped electronic indicator 4, which extends approximately from the center of the annular segment 2 to its inner annulus 2.2. This electronic indicator 4 constantly follows the velocity display, the right-hand limiting line 4.1 of which is constantly in a straight line with the end 3.1 of the luminous band display 3. Within the sector-shaped indicator 4—which can likewise be provided with a scale 4.2—the rotational speed of the engine is then represented as a radially outward running luminous band display 5, which is made a different color than that of the luminous band display 3. The critical speed range is then represented when the luminous band display 5 has approached or—as it visually appears—touched the inner annulus 2.2 of the luminous band display 3, there being the additional feature in this case that the luminous band display 5 can also flash intermittently.

Independently of this, the luminous band display 5 can also be used to signal to the driver appropriate gear-change recommendations by corresponding brief flashing intervals.

With the display made according to the invention, the driver is thus offered an optimum representation for the visual perception of velocity and rotational speed.

Other objects, advantages and novel features of the present invention will become apparent from the following detailed description of the invention when considered in conjunction with the accompanying drawings.

Although the present invention has been described and illustrated in detail, it is to be clearly understood that the same is by way of illustration and example only, and is not to be taken by way of limitation. The spirit and scope of the present invention are to be limited only by the terms of the appended claims.

I claim:

1. A display for displaying a velocity of a vehicle and a rotational speed of a vehicle engine comprising:
   a. an instrument disc having a center and a scaled, annular segment including an inner annulus;
   b. a luminous band display movable along the scaled annular segment for representing the velocity of the vehicle;
   c. a scaled, acute-angled, sector-shaped electronic indicator opening radially outward from the center of the disc and constantly following the movement of the luminous band display; and
   d. a radially, outward-running, luminous band display movable radially within the scaled, acute-angled sector-shaped electronic indicator for representing the rotational speed of the vehicle engine.

2. A display according to claim 1, wherein the luminous band display and the radially, outward-running, luminous band display have different colors.

3. A display according to claim 1, wherein a critical rotational speed of the vehicle engine is represented by the radially, outward-running, luminous band display touching the inner annulus of the scaled, annular segment.

4. A display according to claim 1, wherein an critical rotational speed of the vehicle engine is represented by the radially, outward-running luminous band intermittently flashing.

5. A display according to claim 1, wherein a gear shift recommendation is represented by a brief flashing of the radially, outward-running luminous band display.

* * * * *